United States Patent [19]

Greene et al.

[11] Patent Number: 4,509,996
[45] Date of Patent: Apr. 9, 1985

[54] INJECTION LASER MANUFACTURE

[75] Inventors: Peter D. Greene; Stephen E. H. Turley, both of Harlow, England

[73] Assignee: International Standard Electric Corporation, New York, N.Y.

[21] Appl. No.: 508,293

[22] Filed: Jun. 24, 1983

[30] Foreign Application Priority Data

Nov. 5, 1982 [GB] United Kingdom ............... 8231655

[51] Int. Cl.³ ........................................ H01L 21/208
[52] U.S. Cl. ................................ 148/171; 29/569 L; 29/576 E; 148/172
[58] Field of Search ............. 148/171, 172; 29/569 L, 29/576 E; 372/45

[56] References Cited

U.S. PATENT DOCUMENTS

| 3,978,428 | 8/1976 | Burnham et al. | 148/171 X |
| 4,033,796 | 7/1977 | Burnham et al. | 148/175 |
| 4,251,298 | 2/1981 | Thompson | 148/171 |
| 4,287,485 | 9/1981 | Hsieh | 148/171 X |
| 4,321,556 | 3/1982 | Sakuma | 148/171 X |
| 4,366,568 | 12/1982 | Shimizu et al. | 148/171 X |
| 4,366,569 | 12/1982 | Hirao et al. | 148/171 X |
| 4,380,861 | 4/1983 | Sugino et al. | 148/171 X |
| 4,429,395 | 1/1984 | Olsen et al. | 148/171 X |

*Primary Examiner*—G. Ozaki
*Attorney, Agent, or Firm*—John T. O'Halloran; Peter R. Ruzek

[57] ABSTRACT

A method of making a channel substrate buried heterostructure InP/(In,Ga)(As,P) laser avoids the need to use two separate stages of epitaxial growth by using a channel in a (100) surface substrate 1 extending in the [011] direction with {111}B sides. This allows the channel to be made before the growth of an (In,Ga)(As,P) blocking layer 3 which can be grown under conditions which do not require the use of a mask to prevent nucleation on the channel sides. The same technique is also applicable to the manufacture of a terraced substrate laser incorporating a blocking layer.

9 Claims, 4 Drawing Figures

INJECTION LASER MANUFACTURE

This invention relates to the manufacture of injection lasers, and in particular to the manufacture of lasers whose structure requires them to be made by methods involving epitaxial growth upon a non-planar substrate. Two such laser types are the channelled substrate buried heterostructure (CSBH) laser and the terraced substrate (TS) laser. The invention is particularly concerned with a manufacture that uses epitaxy to grow the requisite structure, that involves the epitaxial growth of a blocking layer to produce reverse biassed junctions to constrict current flow, but does not require to interrupt the epitaxial growth for intermediate processing of a different technology type, such as masking and etching.

According to the present invention there is provided a method of making an injection laser in which in operation of the completed laser current flow through the laser active layer is confined at least in part by reverse biassed junctions provided by spaced apart parts of a blocking layer, wherein the blocking layer is grown by liquid phase epitaxy upon a non-planar substrate presenting different crystal planes to the growth selected such that the growth produces the separated parts of the blocking layer without recourse to masking thereby permitting this growth to be directly succeeded, without interruption by intermediate processing technology of a different type, by the growth of further layers of the laser structure by liquid phase epitaxy.

Growth of the active layer material in a CSBH laser is confined to a strip registering with a channel in the underlying substrate material, and this feature is employed to give a measure of minority carrier and optical confinement in the lateral direction (the direction lying in the plane of the substrate surface that is at right angles to the laser axis). To provide a low threshold current for such devices it has been prior practice to provide reverse biassed junctions on either flank of the active region which will serve to block shunt current not passing through the active region. In the past this has been provided by using liquid phase epitaxy to grow layers on a planar substrate to provide a reverse biassed junction, and then after photolithography and etching of a channel through this junction, growing the rest of the structure in a second stage of liquid phase epitaxy. This procedure, involving two separated stages of epitaxy, is rather complicated and time consuming. In particular the degradation in surface flatness resulting from the growth of the first stage epitaxial layers can present problems in providing acceptable photolithography in preparation for the second stage of epitaxial growth.

According to the present invention in its application to CSBH laser manufacture, there is provided a method of making an InP/(In,Ga)(As,P) channelled substrate buried heterostructure injection laser, which method includes the steps, of preparing a channel extending in the [011] direction with {111}B sides in the (100) surface of an InP substrate of a first conductivity type;

of growing by liquid phase epitaxy a blocking layer of lattice matched (In,Ga)(As,P) of the opposite conductivity type on the substrate (100) surface under conditions of limited supersaturation that provide a discontinuous layer interrupted by a no-growth region on each of the two {111}B channel sides;

of growing by liquid phase epitaxy a lower passive layer of the first conductivity type of InP, or of lattice matched (In,Ga)(As,P), to cover the material of the blocking layer and partially, but not completely, fill the groove;

of growing on the lower passive layer by liquid phase epitaxy an active layer of lattice matched (In,Ga)(As,P) of lower band gap than the material of the lower passive layer under conditions that provide growth in the region registering with the channel, which growth is partially or completely pinched off in regions registering with the shoulders of the {111}B channel sides; and of growing by liquid phase epitaxy an upper passive layer, which is of the opposite conductivity type to that of the lower passive layer, and is of InP or of lattice matched (In,Ga)(As,P) of higher band gap material than that of the active layer, to cover the active layer.

The method of the invention, in its application to the manufacture of CSBH lasers, relies upon the fact that it has been found possible to achieve selective growth of (In,Ga)(As,P) on a channelled InP substrate without masking. This is achieved by providing the channel with {111}B walls in a (100) surface, and making use of the fact that epitaxial nucleation of (In,Ga)(As,P) occurs much more readily on the (100) surface than on {111}B surface. This same effect is used in the application of the invention to the manufacture of TS lasers. In a TS laser a measure of lateral optical waveguiding is provided for the active layer by growing it on a terraced substrate and making use of the fact that growth conditions can be arranged to ensure that the growth is thicker in the region registering with the terrace than in the flanking regions. Prior art methods of providing a blocking layer to produce reverse biassed junctions on either flank of the active region of a TS laser would have necessitated some form of masking and etching processing for the selective removal of the material of the blocking layer from the terrace or for prevention of its growth in this region. This processing would have necessitated interrupting the epitaxial growth, and so vitiated a major advantage of adopting the TS structure in the first place, namely the simplicity of its manufacture. The present invention discloses how a blocking layer can be provided in a manner that without the use of a mask will result in no growth of blocking material in the region of the terrace.

According to the present invention in its application to TS laser manufacture, there is provided a method of making an InP/(In,Ga)(As,P) terraced substrate injection laser, which method includes the steps, of preparing an InP substrate of first conductivity type a terraced surface having upper and lower (100) surfaces joined by a {100}B plane terrace;

of growing by liquid phase epitaxy a blocking layer of lattice matched (In,Ga)(As,P) of the opposite conductivity type on the terraced surface under conditions of limited supersaturation that provide a discontinuous layer interrupted by a no-growth region on the {111}B terrace face;

of growing by liquid phase epitaxy a lower passive layer of the first conductivity type of InP, or of lattice matched (In,Ga)(As,P), to cover the blocking layer;

of growing on the lower passive layer by liquid phase epitaxy an active layer of lattice matched (In,Ga)(As,P) of lower band gap than the material of the lower passive layer under conditions that provide growth in the region registering with the terrace, which growth is partially or completely pinched off in the region registering with the shoulder of the terrace; and of growing by liquid phase epitaxy an upper passive layer, which is of the opposite conductivity type to that of the lower passive layer, and is of InP or of lattice matched (In,Ga)(As,P) of higher band gap material than that of the active layer, to cover the active layer.

There follows a description of the method of making CSBH lasers and TS lasers embodying the invention in preferred forms, the description refers to the accompanying drawings in which.

Figure 1:
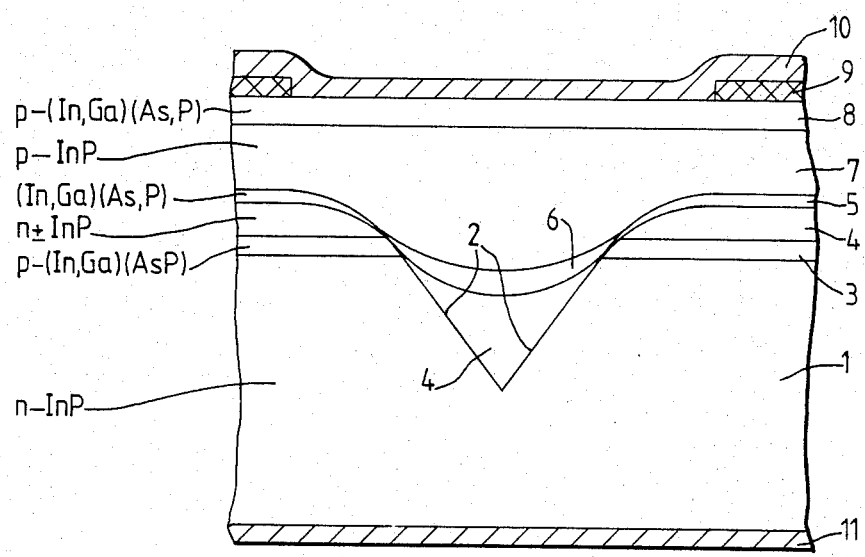
FIG. 1 depicts a schematic cross-section of a CSBH laser in a plane normal to the laser axis.

Referring to FIG. 1, the (100) surface of an $n^+$-type sulphur doped InP substrate 1 is provided with a pyrolytically deposited silica masking layer (not shown) in which is opened up a 2 micron wide window extending in the [011] direction (as distinct from the [01$\bar{1}$] direction). The surface is then etched in 1:1 Hbr:H$_3$PO$_4$ typically for about 90 seconds to produce a channel with {111}B walls 2, before removing the silica mask with buffered HF. The channelled substrate is then placed in a boat ready for the growth of a succession of layers by liquid phase epitaxy.

The first epitaxial layer to be grown is a blocking layer 3 of lattice matched (In,Ga)(As,P) of a composition possessing a band gap corresponding to an emission wavelength $\lambda$ equal to 1.05 $\mu$m, which is doped lightly with zinc to render it p-type. This layer is grown under conditions of limited supersaturation providing a half micron thick layer in a total growth time of between 2 and 10 seconds. This produces growth on the (100) substrate surface, but not on the {111}B sides of the channel. The choice of composition for this quaternary material growth is somewhat arbitrary, with the particular composition being chosen because details of its growth characteristics were already known from other work not concerned with the present invention.

The next layer to be grown is a lower passive layer 4 of germanium doped $n^+$-type InP. Alternatively tellurium or selenium can be substituted for the germanium. For this layer a total growth time of 10 seconds provides a layer thickness of about 0.2 microns on the flat (100) surfaces. The junction between this material and the underlying blocking layer 3 provides a p-n junction which, in operation of the completed device, is reverse biassed and hence prevents shunt current flow in the wings of the device beyond the region registering with the channel.

A lattice matched active layer 5 of (In,Ga)(As,P) is next grown to cover the growth of the n-type passive layer. The composition determines the emission wavelength, in this case $\lambda = 1.3$ $\mu$m, and it can be of either conductivity type. (An alternative particularly favoured emission wavelength is $\lambda = 1.55$ $\mu$m.) In this instance it is grown from undoped material, though there now appears to be some suggestion that an advantage may be secured in terms of temperature performance by making it of $n^+$-type material. The conditions of supersaturation are chosen in conventional manner for CSBH lasers so that layer 5 is preferably not continuous but contains an active region 6 which is in registry with the underlying channel but is completely separated from the two flanking regions overlying the (100) surface portions of the substrate. In the active region 6 the active layer is designed to be typically about 0.2 microns thick at the thickest point registering with the centre of the channel, and this is achieved in a growth period of 3 seconds or less. Complete pinch off of growth of the active layer at the shoulders of the {111}B walls is not essential since localised thinning of the active layer in these regions will also produce a measure of lateral waveguiding effect.

The active layer is then covered with an upper passive layer 7 of p-type zinc doped InP so that a p-n junction is formed at or near the upper surface of the active region 6, its lower surface, or somewhere in between. This is for the generation of minority carriers when the laser is being operated. This layer 7 is continuous, and preferably is grown under conditions tending to fill in the residual channelling to leave a substantially planar upper surface. Typically a growth time in the region of 100 seconds is employed to produce a layer that is about 1.5 microns thick in the regions remote from the underlying channel.

The final epitaxially grown layer is a thin capping layer 8 of lattice matched $p^+$-type zinc doped (In,Ga)(As,P) about 0.3 to 0.4 microns thick provided to facilitate the making of an evaporated contact with the p-type material. This can be omitted, particularly if the contact is an alloyed contact.

After all the layers have been grown the exposed surface is covered with an electrically insulating layer 9 for instance of r.f. plasma deposited silica through which a 5 to 10 micron wide window registering with the underlying channel is opened using standard photolithographic techniques. A shallow zinc diffusion may be performed at this stage, and then a standard evaporated contact layer 10 is applied.

This evaporated contact layer is provided by a triple evaporation, depositing first a layer of titanium, then a layer of platinum or palladium, and finally a layer of gold.

Preparation of this contact layer is followed by the preparation of an alloyed contact layer 11 for the n-type side. For this purpose a mixture of tin and gold is deposited by evaporation from an alloy source, is alloyed into the substrate, and then is covered by an evaporated layer of titanium, itself covered by an evaporated layer of gold.

Although the upper and lower passive layers have been described as being made of InP, either or both of them could have been lattice matched quaternary material, provided that the band gap in each case is kept larger than that of the material of the active layer so as to retain the appropriate conditions for optical guidance and carrier confinement.

Figure 2:
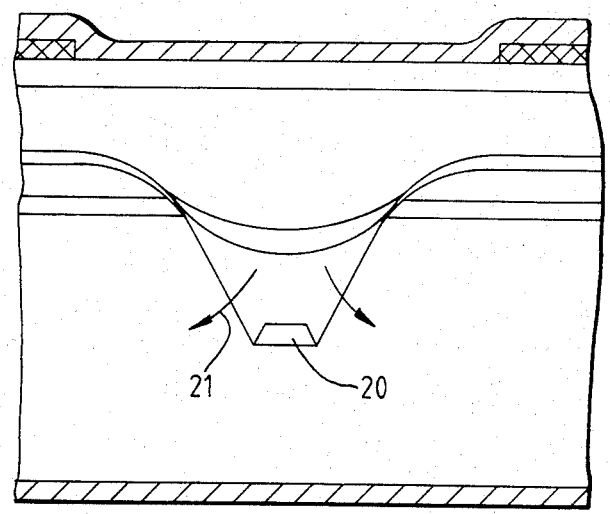
FIG. 2 depicts an equivalent cross-section of a similar laser.

FIG. 2 depicts a generally similar structure of a laser to that of FIG. 1, but in this instance the profile of the channel in the substrate, and/or the growth conditions, are such that some growth of the blocking layer material occurs also at the bottom of the channel in the region 20. This produces an extra region of reverse biassed junction, but the current flow through the active region can bypass it in the regions indicated by the arrows 21.

Figure 3:
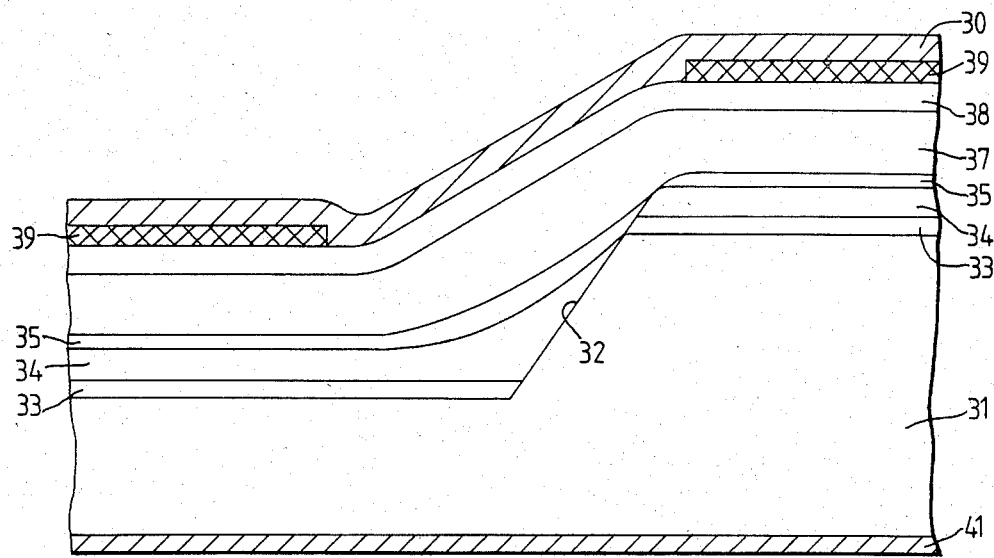
FIG. 3 depicts a schematic cross-section of a TS laser in a plane normal to the laser axis.

FIG. 3 depicts a section through the TS laser and from this it can be seen that the structure is in some respects equivalent to half a FIG. 2 CSBH laser with an infinitely wide channel. The manufacturing processes for the two lasers are also closely similar in many respects. Thus the (100) surface of an n⁺-type sulphur doped InP substrate 31 is provided with a pyrolytically deposited silica masking layer (not shown) and then the left half of this is removed to leave an edge extending across the middle of the (100) surface in the {011} direction (as distinct from the [011] direction). The surface is then etched in 1:1 HBr:H$_3$PO$_4$ typically for about 2 minutes, instead of the 90 seconds used for the CSBH laser, to give a slightly deeper etch. This produces the two levels of (100) plane linked by a {111}B terrace 32. Thereafter blocking, lower passive, active, upper passive, and capping layers 33, 34, 35, 37 and 38, respectively, are grown in the same manner as their counterparts 3, 4, 5, 7 and 8 in the CSBH laser. Similarly the laser is provided with a stripe contact by means of an evaporated contact layer 30 and masking layer 39, and an alloyed contact layer 41 is provided for the substrate, these contacts being provided in the manner described previously for the provision of the corresponding contacts 10 and 11.

Figure 4:
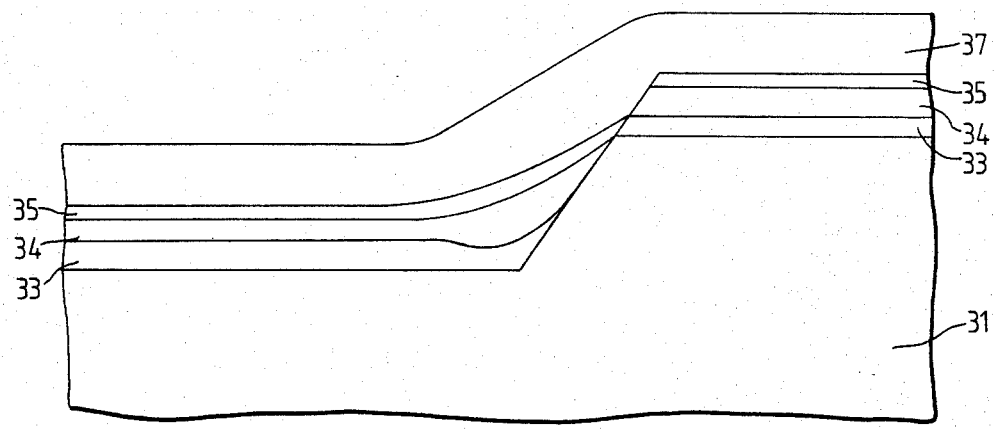
FIG. 4 is a sketch of a photomicrograph of the epitaxial grown layers of a TS laser structure.

FIG. 4 is a sketch of a photomicrograph and shows that when the blocking layer 33 was grown the growth extended up the terrace to a height greater than the mean thickness of the layer, but that in the immediately adjacent region the growth thickness was reduced beneath average, possibly as a result of depletion effects. When the lower passive layer 34 was grown, the growth extended up the whole height of the original terrace, but not to the full height of the terrace as enlarged by the growth of the blocking layer. A small alteration of the growth conditions can be made to change this, in which case the growth of the active layer 35 can be made continuous rather than as divided into two regions by the shoulder of the enlarged terrace as shown in FIG. 3. It is believed that the slight change in wall orientation resulting from the extension of growth up the terrace is the factor responsible for the initial growth registering with the terrace to be diminished so as to produce a divided blocking layer, whereas in the later growth of the active layer the growth registering with the terrace is enhanced so as to give the locally thickened region of the active layer required for lateral waveguiding.

We claim:

1. A method of making an injection laser in which in operation of the completed laser current flow through the laser active layer is confined at least in part by reverse biassed junctions provided by spaced apart parts of a blocking layer, wherein the blocking layer is grown by liquid phase epitaxy upon a non-planar substrate presenting different crystal planes to the growth, the crystal planes being selected such that the growth takes place on spatially separated first surfaces parallel to one of the different crystal planes but not on any second surface situated between and interconnecting the first surfaces and extending along another of the different crystal planes to produce the spaced apart parts of the blocking layer without recourse to masking thereby permitting this growth to be directly succeeded, without interruption by intermediate processing technology of a different type, by the growth of further layers of the laser structure by liquid phase epitaxy.

2. A method as claimed in claim 1, wherein the laser is an InP/(In,Ga)(As,P) laser.

3. A method of making an InP/(In,Ga)(As,P) channelled substrate buried heterostructure injection laser, which method includes the steps, of preparing a channel extending in the [011] direction with {111}B sides in the (100) surface of an InP substrate of a first conductivity type;

of growing by liquid phase epitaxy a blocking layer of lattice matched (In,Ga)(As,P) of the opposite conductivity type on the substrate (100) surface under conditions of limited supersaturation that provide a discontinuous layer interrupted by a no-growth region on each of the two {111}B channel sides;

of growing by liquid phase epitaxy a lower passive layer of the first conductivity type of InP, or of lattice matched (In,Ga)(As,P), to cover the material of the blocking layer and partially, but not completely, fill the groove;

of growing on the lower passive layer by liquid phase epitaxy an active layer of lattice matched (In,Ga)-(As,P) of lower band gap than the material of the lower passive layer under conditions that provide growth in the region registering with the channel, which growth is partially or completely pinched off in the regions registering with the shoulders of the {111}B channel sides; and of growing by liquid phase epitaxy an upper passive layer, which is of the opposite conductivity type to that of the lower passive layer, and is of InP or of lattice matched (In,Ga)(As,P) of higher band gap material than that of the active layer, to cover the active layer.

4. A method as claimed in claim 3, wherein the growth conditions are such that the growth of the active layer is completely pinched off in the regions registering with the shoulders of the {111}B channel sides.

5. A method as claimed in claim 3, wherein the upper and lower passive layers are both grown in InP.

6. A method as claimed in claim 3, wherein the blocking layer is grown in P-type material.

7. A method of making an InP/(In,Ga)(As,P) terraced substrate injection laser, which method includes the steps, of preparing an InP substrate of first conductivity type a terraced surface having upper and lower (100) surfaces joined by a {111}B plane terrace;

of growing by liquid phase epitaxy a blocking layer of lattice matched (In,Ga)(As,P) of the opposite conductivity type on the terraced surface under conditions of limited supersaturation that provide a discontinuous layer interrupted by a no-growth region on the {111}B terrace face;

of growing by liquid phase epitaxy a lower passive layer of the first conductivity type of InP, or of lattice matched (In,Ga)(As,P), to cover the blocking layer;

of growing on the lower passive layer by liquid phase epitaxy an active layer of lattice matched (In,Ga)-(As,P) of lower band gap than the material of the lower passive layer under conditions that provide growth in the region registering with the terrace, which growth is partially or completely pinched off in the region registering with the shoulder of the terrace; and of growing by liquid phase epitaxy an upper passive layer, which is of the opposite conductivity type to that of the lower passive layer, and is of InP or of lattice matched (In,Ga)(As,P) of higher band gap material than that of the active layer, to cover the active layer.

8. A method as claimed in claim 7, wherein the upper and lower passive layers are both grown in InP.

9. A method as claimed in claim 7, wherein the blocking layer is grown in p-type material.

* * * * *